(12) United States Patent
Roy et al.

(10) Patent No.: US 12,707,701 B2
(45) Date of Patent: Aug. 11, 2026

(54) TRENCH POWER DEVICE WITH ENHANCED CHARGE CARRIER MOBILITY

(71) Applicant: Infineon Technologies AG, Neubiberg (DE)

(72) Inventors: Saurabh Roy, Villach (AT); Hans-Joachim Schulze, Taufkirchen (DE); Oliver Blank, Villach (AT); Josef Anton Moser, Sattendorf (AT); Thomas Aichinger, Faak am See (AT)

(73) Assignee: Infineon Technologies AG, Neubiberg (DE)

( * ) Notice: Subject to any disclaimer, the term of this patent is extended or adjusted under 35 U.S.C. 154(b) by 894 days.

(21) Appl. No.: 18/072,965

(22) Filed: Dec. 1, 2022

(65) Prior Publication Data

US 2023/0178615 A1 Jun. 8, 2023

(30) Foreign Application Priority Data

Dec. 7, 2021 (DE) ........................ 102021132175.1

(51) Int. Cl.

| | |
|---|---|
| ***H10D 64/27*** | (2025.01) |
| ***H10D 30/66*** | (2025.01) |
| ***H10D 62/17*** | (2025.01) |
| ***H10D 64/00*** | (2025.01) |

(52) U.S. Cl.

CPC ......... *H10D 64/513* (2025.01); *H10D 30/668* (2025.01); *H10D 62/235* (2025.01); *H10D 62/393* (2025.01); *H10D 64/117* (2025.01)

(58) Field of Classification Search

CPC .. H10D 64/513; H10D 64/117; H10D 62/235; H10D 30/668; H10D 62/393

USPC ........................................................... 27/330

See application file for complete search history.

(56) References Cited

U.S. PATENT DOCUMENTS

| | | | |
|---|---|---|---|
| 7,453,108 | B2 | 11/2008 | Jin |
| 7,586,158 | B2 | 9/2009 | Hierlemann et al. |
| 8,035,164 | B2 | 10/2011 | Kato |
| 9,537,006 | B2 | 1/2017 | Von Kluge |

(Continued)

FOREIGN PATENT DOCUMENTS

| | | | |
|---|---|---|---|
| CN | 201804553 | U | 4/2011 |
| CN | 208998969 | U | 6/2019 |

(Continued)

OTHER PUBLICATIONS

Jana, Raj K., et al., "Transistor Switches Using Active Piezoelectric Gate Barriers", IEEE Journal on Exploratory Solid-State Computational Devices and Circuits, vol. 1, Jun. 22, 2015, pp. 35-42.

(Continued)

*Primary Examiner* — Igwe U Anya

(74) *Attorney, Agent, or Firm* — Murphy, Bilak & Homiller, PLLC

(57) ABSTRACT

A power transistor device includes a semiconductor substrate, a gate trench extending into the semiconductor substrate, a transistor gate provided in the gate trench, and an insulating structure formed between the transistor gate and a side wall of the gate trench. The insulating structure is configured to electrically insulate the transistor gate from a channel region which extends along the side wall of the gate trench. The insulating structure includes a layer of piezoelectric material.

26 Claims, 7 Drawing Sheets

(56) References Cited

U.S. PATENT DOCUMENTS

| | | | | |
|---|---|---|---|---|
| 2005/0145883 | A1* | 7/2005 | Beach | H10D 62/151<br>257/194 |
| 2020/0144055 | A1 | 5/2020 | Yoshida et al. | |
| 2020/0220001 | A1* | 7/2020 | Shimizu | H10D 64/693 |
| 2020/0411647 | A1* | 12/2020 | Matsuyama | H10D 30/0291 |
| 2022/0406937 | A1* | 12/2022 | Karner | H10D 64/513 |

FOREIGN PATENT DOCUMENTS

| | | | |
|---|---|---|---|
| CN | 110277440 | A | 9/2019 |
| DE | 102004058431 | A1 | 9/2005 |

OTHER PUBLICATIONS

Winterfeld, H., et al., “A stress sensor based on a silicon field effect transistor comprising a piezoelectric AlN gate dielectric”, Journal of Materials Science: Materials in Electronics (2019) 30; https://doi.org/10.1007/s10854-019-01502-x, May 21, 2019, pp. 11493-11498.

* cited by examiner

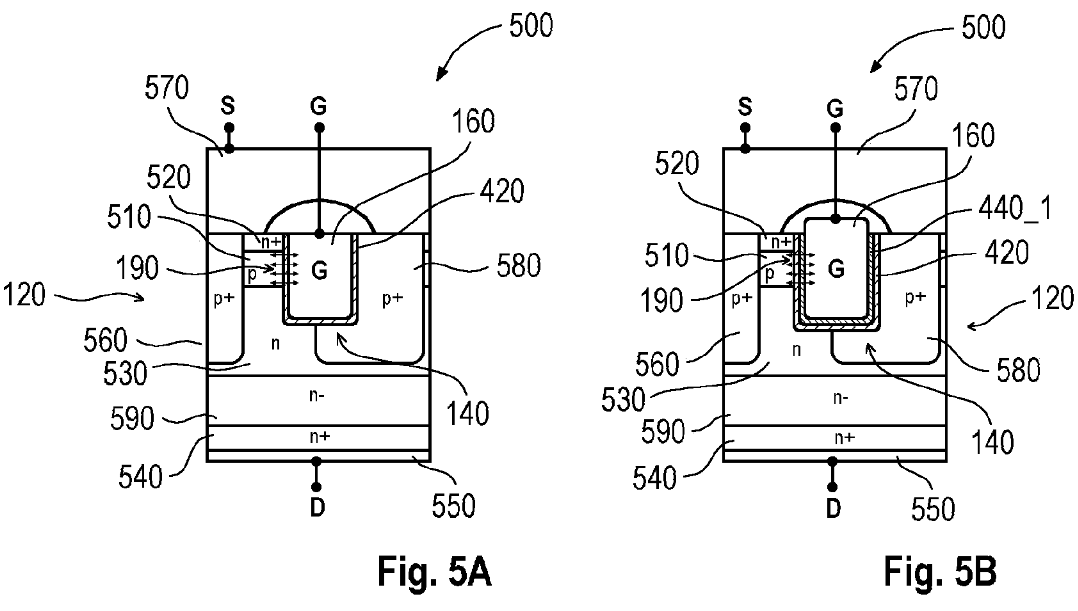
Fig. 5A
Fig. 5B
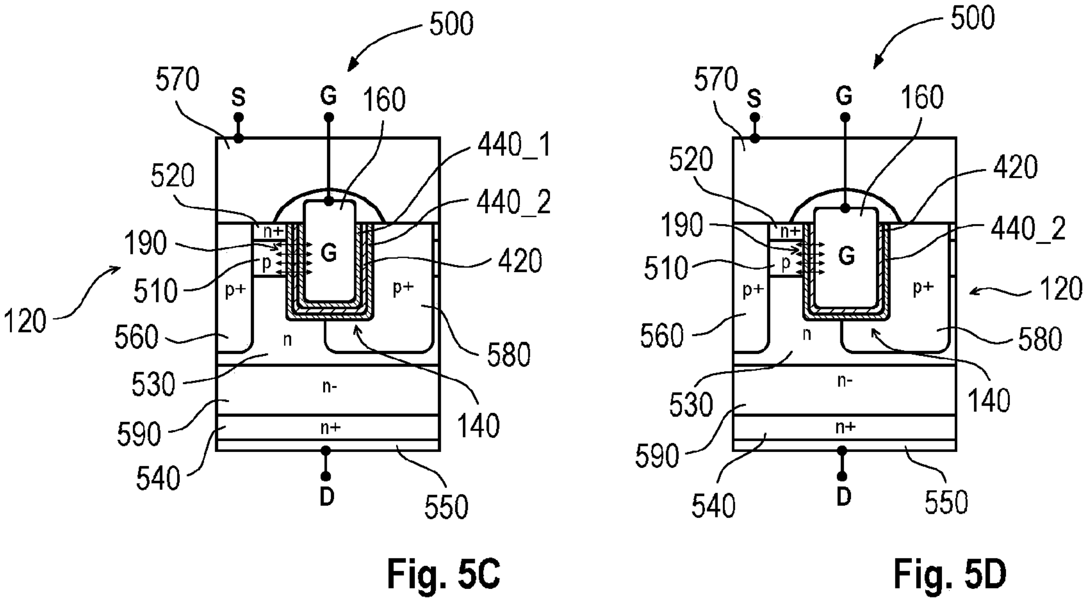
Fig. 5C
Fig. 5D

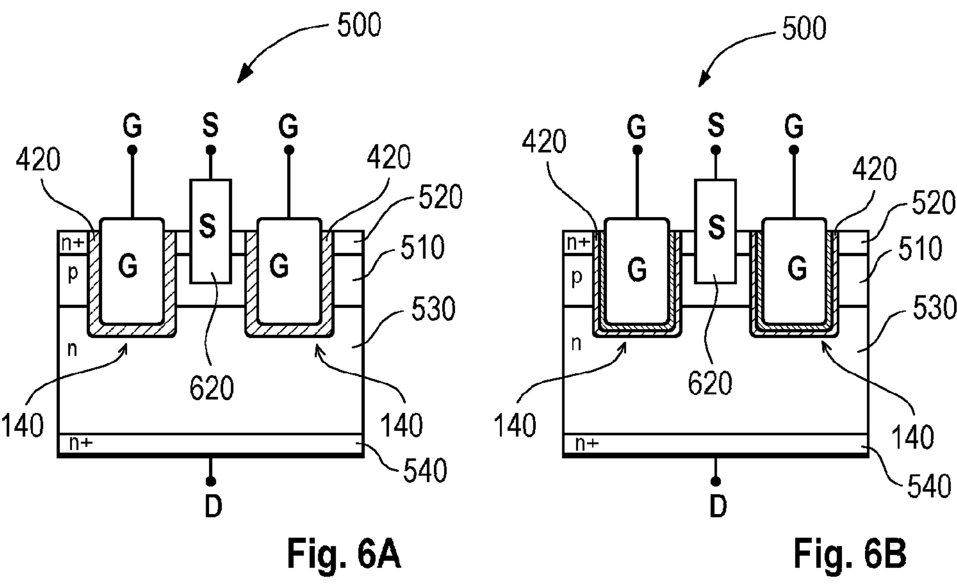
Fig. 6A
Fig. 6B
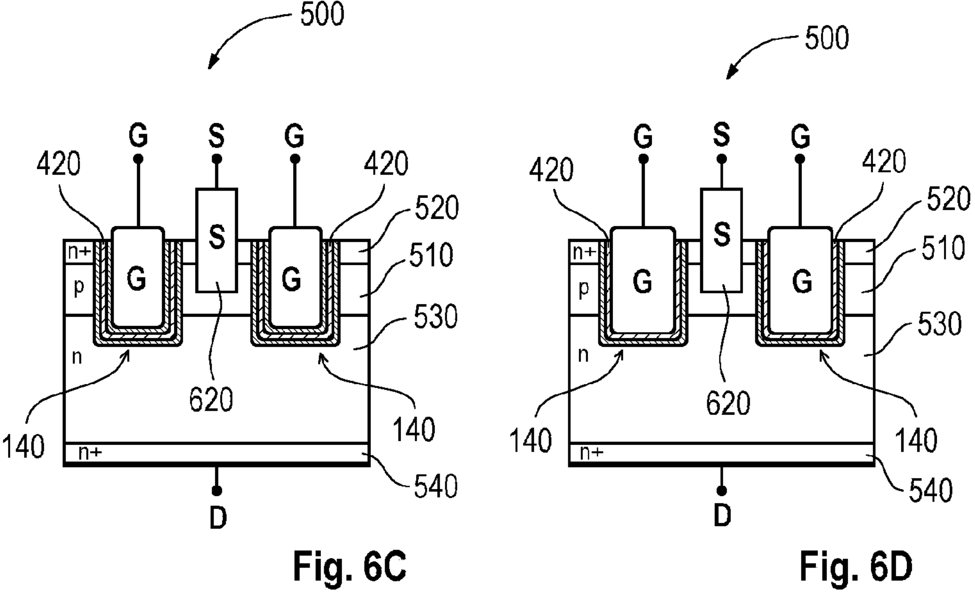
Fig. 6C
Fig. 6D

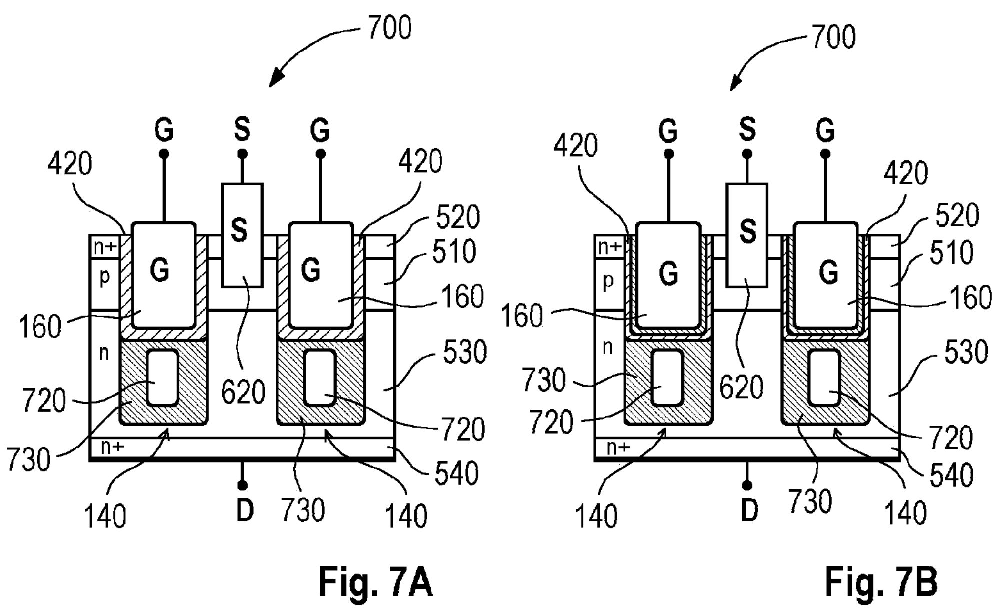
Fig. 7A
Fig. 7B
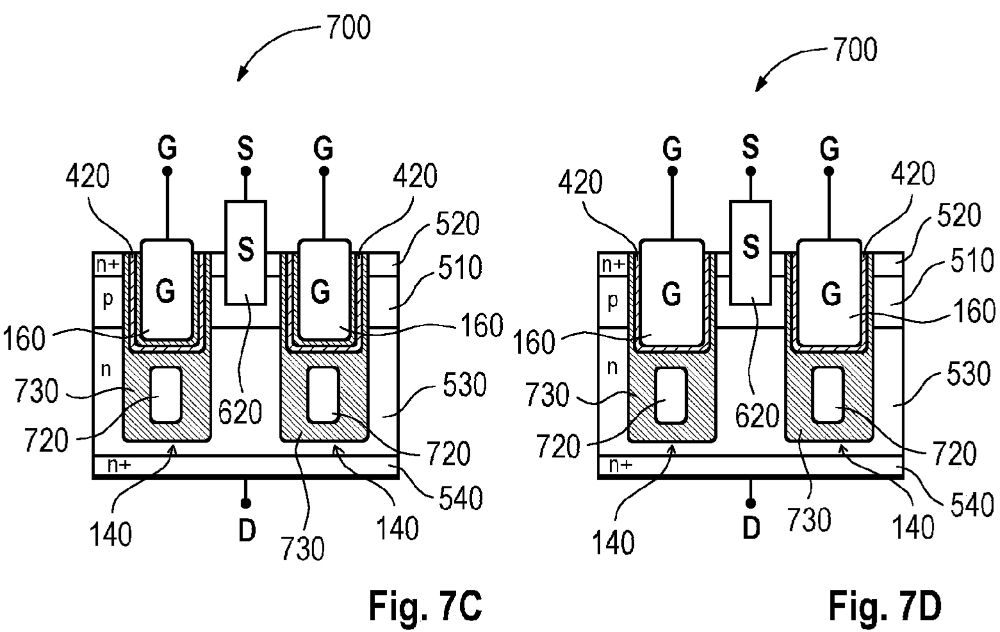
Fig. 7C
Fig. 7D

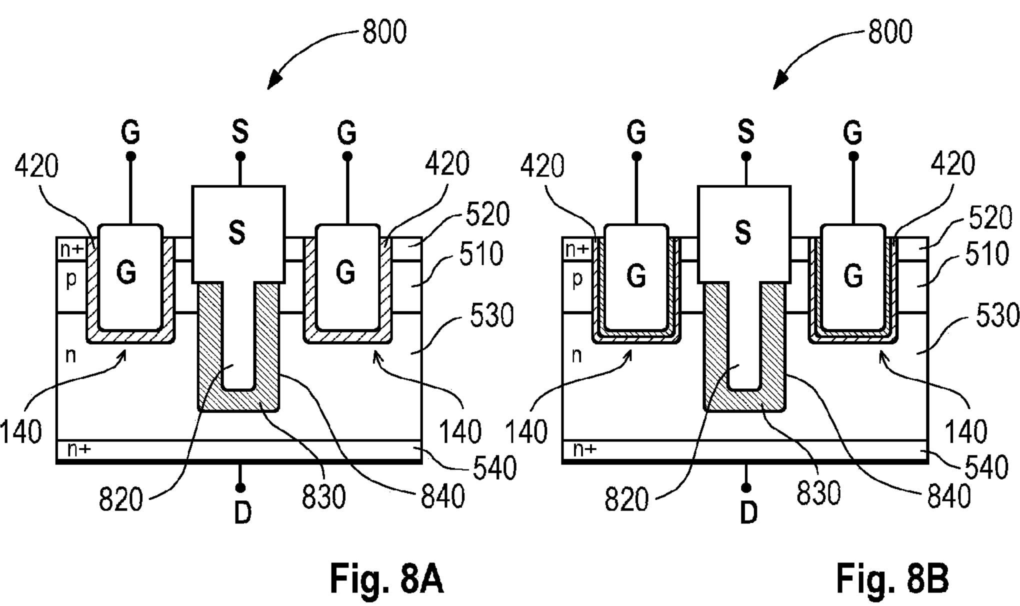
Fig. 8A
Fig. 8B
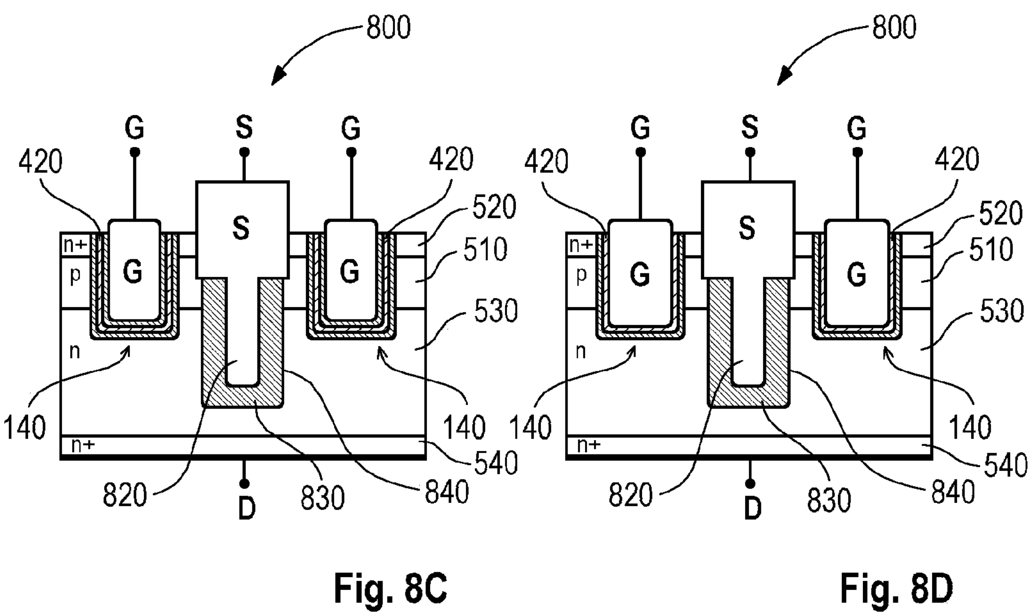
Fig. 8C
Fig. 8D

TRENCH POWER DEVICE WITH ENHANCED CHARGE CARRIER MOBILITY

TECHNICAL FIELD

This disclosure relates to the field of power transistor devices, and in particular to gate trench power transistor devices.

BACKGROUND

One of the most important criteria for developing next generations of power transistors involve lowering the $R_{ON}$, which is the ON state resistance of a power MOSFET (metal oxide semiconductor filed-effect transistor) structure. Several activities in this direction have been carried out to minimize the channel resistance, e.g. by fine patterning of trench structures, improving semiconductor to dielectric interface etc. Most conventional transistors make use of a passive insulating barrier layer between the gate metal and the semiconductor channel to modulate the density of the conduction channel electrons.

SUMMARY

According to a first aspect of the disclosure a power transistor device includes a semiconductor substrate, a gate trench extending into the semiconductor substrate, a transistor gate provided in the gate trench and an insulating structure formed between the transistor gate and a side wall of the gate trench. The insulating structure is configured to electrically insulate the transistor gate from a channel region which extends along the side wall of the gate trench. The insulating structure comprises a layer of piezoelectric material.

According to a second aspect of the disclosure a power transistor device includes a semiconductor substrate, a gate trench extending into the semiconductor substrate, a transistor gate provided in the gate trench, a first field plate provided in the gate trench below the transistor gate, and an insulating structure formed between the first field plate and a side wall of the gate trench, the insulating structure being configured to electrically insulate the first field plate from a drift zone region which extends along the side wall of the gate trench, the insulating structure comprising a layer of piezoelectric material.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

FIG. 5A is a schematic partial cross-sectional view of an exemplary power transistor device having a gate trench of the first example of the gate insulating structure of FIG. 4A.

FIG. 5B is a schematic partial cross-sectional view of an exemplary power transistor device having a gate trench of the second example of the gate insulating structure of FIG. 4B.

FIG. 5C is a schematic partial cross-sectional view of an exemplary power transistor device having a gate trench of the third example of the gate insulating structure of FIG. 4C.

FIG. 5D is a schematic partial cross-sectional view of an exemplary power transistor device having a gate trench of the fourth example of the gate insulating structure of FIG. 4D.

FIG. 6A is a schematic partial cross-sectional view of a MOSFET including a gate trench of the first example of the gate insulating structure of FIG. 4A.

FIG. 6B is a schematic partial cross-sectional view of a MOSFET including a gate trench of the second example of the gate insulating structure of FIG. 4B.

FIG. 6C is a schematic partial cross-sectional view of a MOSFET including a gate trench of the third example of the gate insulating structure of FIG. 4C.

FIG. 6D is a schematic partial cross-sectional view of a MOSFET including a gate trench of the fourth example of the gate insulating structure of FIG. 4D.

FIG. 7A is a schematic partial cross-sectional view of a MOSFET including a gate trench of the first example of the gate insulating structure and a field plate located in the gate trench.

FIG. 7B is a schematic partial cross-sectional view of a MOSFET including a gate trench of the second example of the gate insulating structure and a field plate located in the gate trench.

FIG. 7C is a schematic partial cross-sectional view of a MOSFET including a gate trench of the third example of the gate insulating structure and a field plate located in the gate trench.

FIG. 7D is a schematic partial cross-sectional view of a MOSFET including a gate trench of the fourth example of the gate insulating structure and a field plate located in the gate trench.

FIG. 8A is a schematic partial cross-sectional view of a MOSFET including a gate trench of the first example of the gate insulating structure and a field plate located in a separate field plate trench.

FIG. 8B is a schematic partial cross-sectional view of a MOSFET including a gate trench of the second example of the gate insulating structure and a field plate located in separate field plate trench.

FIG. 8C is a schematic partial cross-sectional view of a MOSFET including a gate trench of the third example of the gate insulating structure and a field plate located in separate field plate trench.

FIG. 8D is a schematic partial cross-sectional view of a MOSFET including a gate trench of the fourth example of the gate insulating structure and a field plate located in separate field plate trench.

DETAILED DESCRIPTION

As used in this specification, layers or elements illustrated as adjacent layers or elements are not necessarily directly contacted together; intervening elements or layers may be provided between such layers or elements. However, in accordance with the disclosure, elements or layers illustrated as adjacent layers or elements may in particular be directly contacted together, i.e. no intervening elements or layers are provided between these layers or elements, respectively.

The words "over" or "beneath" with regard to a part, element or material layer formed or located or disposed or arranged or placed "over" or "beneath" a surface may be used herein to mean that the part, element or material layer be located (e.g. formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
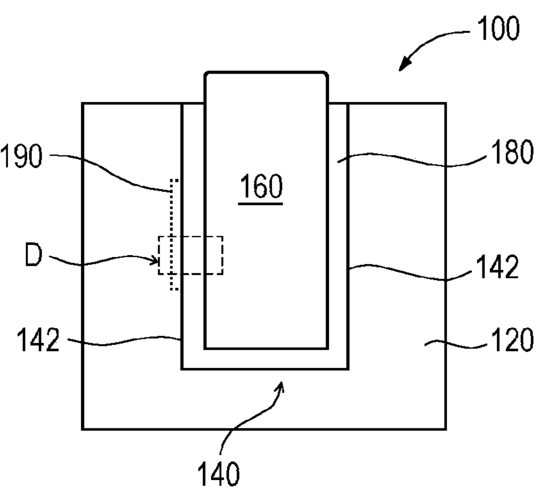
FIG. 1 is a schematic partial cross-sectional view of an example of a trench power transistor device.

FIG. 1 illustrates a partial sectional view of an example of a power transistor device 100. The power transistor device 100 includes a semiconductor substrate 120. The power transistor device 100 further includes one or more gate trenches 140 extending into the semiconductor substrate 120. In FIG. 1 only a single gate trench 120 is shown. However, the semiconductor device 100 may include a plurality of such gate trenches 120 with the same or similar construction (not shown).

The power transistor device 100 includes a transistor gate 160 (also referred to as gate electrode). The transistor gate 160 is disposed in the gate trench 140.

An insulating structure 180 is formed between the transistor gate 160 and a sidewall 142 of the gate trench 140. A channel region 190 extends along the sidewall 142 of the gate trench 140. For example, the channel region 190 may be located in the semiconductor substrate 120 and directly adjoins the sidewall 142 of the substrate 120. In other examples the channel region 190 may be located in a specific semiconductor sidewall layer (not shown) which extends between the sidewall 142 of the gate trench 140 and the insulting structure 180.

The insulating structure 180 is configured to electrically insulate the transistor gate 160 from the channel region 180. The insulating structure 180 is therefore also referred to as gate dielectric in the art. Further, the insulating structure 180 comprises a layer of piezoelectric material.

The insulating structure 180 may completely cover the sidewall 142 of the gate trench 140. In other words, the transistor gate 160 may be completely separated from the semiconductor substrate 120 by the insulating structure 180.

The semiconductor substrate 120 may be fabricated from specific semiconductor material, for example Si, SiC, GaN, SiGe, GaAs, etc. In particular, the semiconductor substrate 120 may be made of a WBG (wide band gap) semiconductor material such as, e.g., SiC, GaN, and many III-V and II-IV compound semiconductors having a high band gap.

As shown in FIG. 1, the power transistor device 100 has a vertical structure. That is, the electrical load current flows in a direction parallel to the sidewall 142 of the gate trench 140.

The power transistor device 100 may, e.g., be a trench power MOSFET or a trench power IGBT (insulated gate bipolar transistor).

The power transistor device 100 makes use of the converse piezoelectric effect exerted by the layer of piezoelectric material that forms part of the insulating structure 180. More specifically, the layer of piezoelectric material is configured to enhance the mobility of charge carriers in the channel region 190 by introducing strain into the channel region 190 that occurs in an ON state of the power transistor device as a result of the converse piezoelectric effect.

Figure 2:
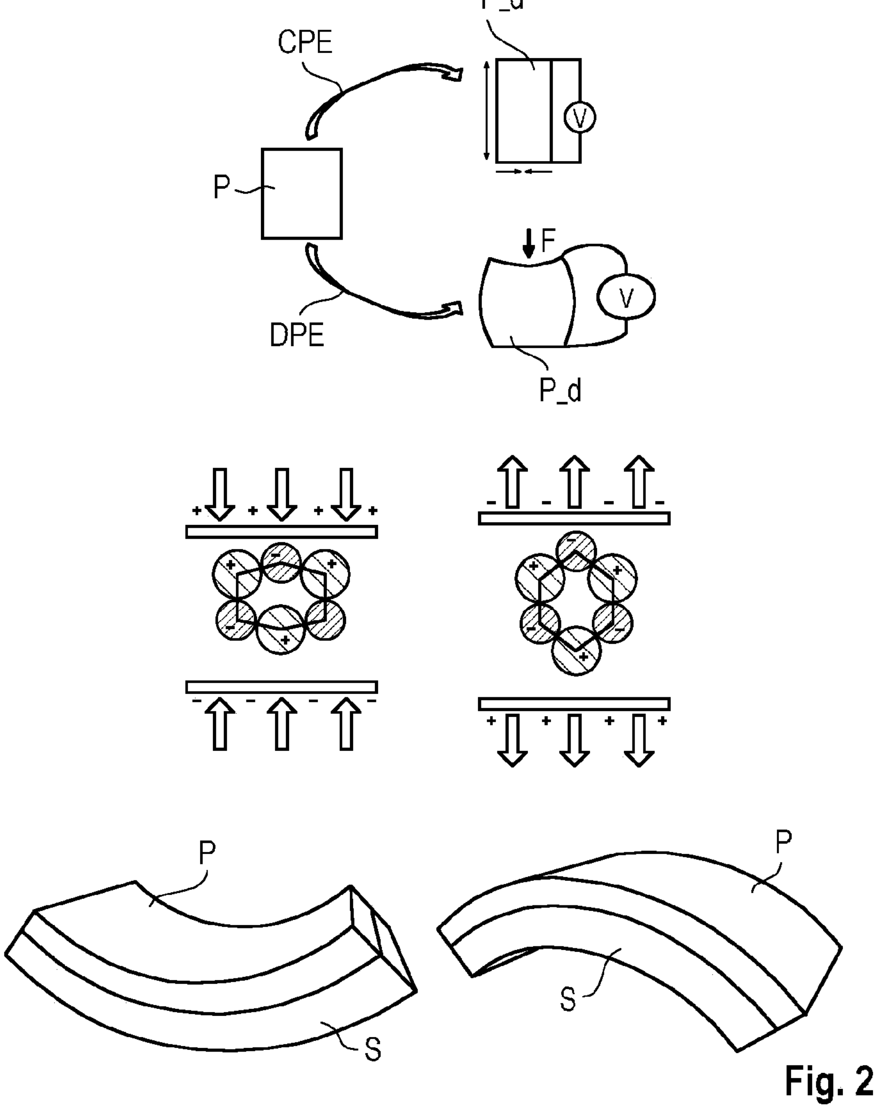
FIG. 2 illustrates the behaviour of a piezoelectric material when the piezoelectric effect and the converse piezoelectric effect occur.

FIG. 2 (upper portion) illustrates the direct piezoelectric effect and the converse piezoelectric effect. A piezoelectric material P is shown without stress or voltage applied. The direct piezoelectric effect DPE involves applying a force F on the piezoelectric material P, which then deforms to piezoelectric material P_d. As a result, a voltage V is output at opposite sides of the deformed piezoelectric material P_d. The converse piezoelectric effect CPE involves applying a voltage V to opposite sides of the piezoelectric material P. As a result, the piezoelectric material P mechanically deforms to P_d'.

FIG. 2, central portion, schematically illustrates the polar insulating lattice of a piezoelectric material in the compressed state (left side) and in the tensile state (right side), and the surface charge (or voltage) generated by the direct piezoelectric effect. Vice versa, in the converse piezoelectric effect, a corresponding surface charge (or voltage) applied to the piezoelectric material P results in a corresponding deformation (compression or tensile deformation, depending on polarity) of the piezoelectric material P.

The lower portion of FIG. 2 illustrates the effect of a layer of piezoelectric material P in contact to a substrate S. Compressive strain in the piezoelectric material P results in a flex-in deformation of the substrate S (lower left portion of FIG. 2), while tensile strain in the piezoelectric material P results in a flex-out deformation of the substrate S (lower right portion of FIG. 2).

Figure 3:
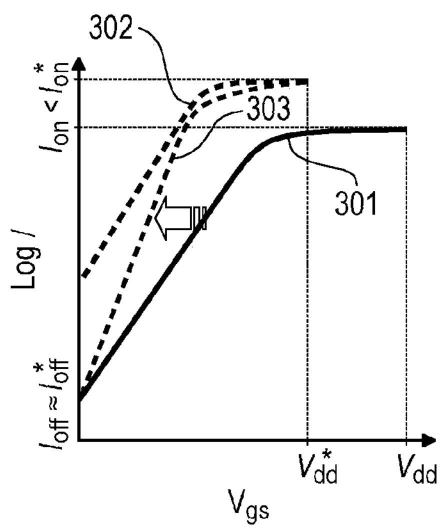
FIG. 3 is a diagram exemplarily illustrating the Drain current versus the Gate-Source voltage $V_{gs}$ of a trench MOSFET having a relaxed (i.e. non-strained) channel region, a statically strained channel region and a strained channel region caused by the converse piezoelectric effect.

FIG. 3 exemplarily illustrates the drain current I versus gate-source voltage $V_{gs}$ characteristics of a power transistor device 100 (e.g. a MOSFET). Curve 301 illustrates the characteristic of the power transistor device 100 with no strain (i.e. without a piezoelectric layer in the insulating structure 180). Curve 302 illustrates the behavior of the drain current I in a statically strained power transistor device 100 (i.e. in a power transistor device 100 with no piezoelectric layer in the insulating structure 180 which, however, contains a material in a pre-stressed state to exert a static strain on the channel region 190). Curve 303 illustrates I for a power transistor device 100 as depicted in FIG. 1, having an insulating structure 180 which comprises a layer of piezoelectric material.

No strain (curve 301) leads to a relatively low OFF state current $I_{off}$ and a relatively low ON state current $I_{on}$. Static strain in the channel region 190 (curve 302) increases the ON state current $I_{on}$ but also increases the OFF state current $I_{off}$, provided all other process parameters are kept the same. The increase in the OFF state current $I_{off}$ is a major drawback of applying a static (constant) strain to the channel region 190.

The introduction of a layer of piezoelectric material in the insulating structure 180 allows to engineer the intrinsic strain imparted to the channel region 190 of the power transistor device 100. The induced strain is only active during the turn-ON state of the power transistor device 100. In other words, the OFF state current $I_{off}$ of curve 303 is as low as $I_{off}$ in the unstrained case, while the ON state current $I_{on}$ rises (see arrow) towards the ON state current $I_{on}$ of the power transistor device 100 having a statically strained channel region 190 (curve 302).

In other words, the piezoelectric layer in the insulating structure 180 allows for dynamic strain engineering, i.e. the intrinsic strain imparted to the channel region 190 mainly depends on the electrical state of the power transistor device 100.

According to curve 303, the strain in the channel region 190 of the power transistor device 100 is increasing for a higher bias (dependent on or corresponding to $V_{gs}$) over the layer of piezoelectric material forming part of the insulating structure (gate dielectric).

For a given strain the conduction band minima in a semiconductor material such as Si, SiC or GaN lower down. The electrons then prefer to populate the lower energy valleys which are energetically more favorable. This results in an increased electron mobility via a reduced effective electron mass. Furthermore, the conduction valley splitting lowers the rate of inter-valley scattering. In other words, the mobility improvement in a strained semiconductor material occurs because of two reasons, namely the reduction of the conductive carrier's effective mass and the reduction in the inter-valley phonon scattering rates.

In power transistor device 100 strain in the channel region 190 arises due to an upward or downward motion (see FIG. 2) of the piezoelectric layer caused by an external bias. The strain is basically zero in the OFF state, meaning that the leakage current (i.e. OFF state current $I_{off}$) and the blocking voltage do not change compared to the relaxed condition (curve 301). In the ON state, by biasing the piezoelectric layer in the insulating structure 180, a high amount of strain can be obtained with the effect that $R_{ON}$ can be significantly lowered compared to the relaxed condition (curve 301).

The operating voltage of the power transistor device 100 without strain (curve 301) is denoted by $V_{dd}$ and the operating voltage of the FET with ON state strain (curve 303) is denoted by $V_{dd}$*. As illustrated in FIG. 3, $V_{dd}^* < V_{dd}$. Further, $I_{ON} < I_{ON}^*$ and $I_{OFF} \approx < I_{OFF}^*$.

Figure 4A:
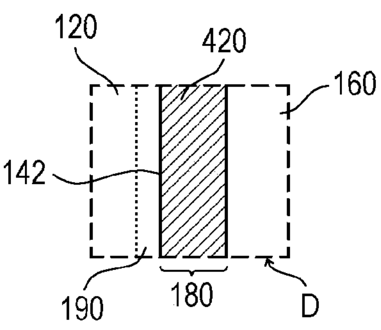
FIG. 4A is a schematic partial cross-sectional view of detail D of FIG. 1 according to a first example of a gate insulating structure including a piezoelectric layer.

FIGS. 4A-4D illustrate four example configurations of placing the layer of piezoelectric material 420 in the insulating structure 180. Referring to FIG. 4A, the layer of piezoelectric material 420 may directly contact the transistor gate 160 (i.e. the gate electrode) and may directly contact the channel region 190. In this case, if the channel region 190 is bordered by the sidewall 142 of the gate trench 140, the layer of piezoelectric material 420 directly contacts the sidewall 142. In other words, in FIG. 4A the insulating structure 180 is made only of the layer of piezoelectric material 420.

Figure 4B:
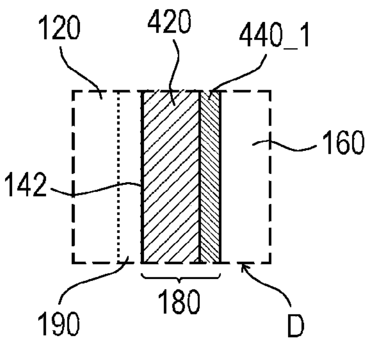
FIG. 4B is a schematic partial cross-sectional view of detail D of FIG. 1 according to a second example of a gate insulating structure including a piezoelectric layer.

Referring to FIG. 4B, according to a second example, the insulating structure 180 may further comprise a first insulating layer 440_1. The first insulating layer 440_1 may be sandwiched between the transistor gate 160 and the layer of piezoelectric material 420. Optionally, the layer of piezoelectric material 420 may directly contact the channel region 190 (and/or the sidewall 142 as explained above). In FIG. 4B the insulating structure 180 may, e.g., be composed only of the layer of piezoelectric material 420 and the first insulating layer 440_1.

Figure 4C:
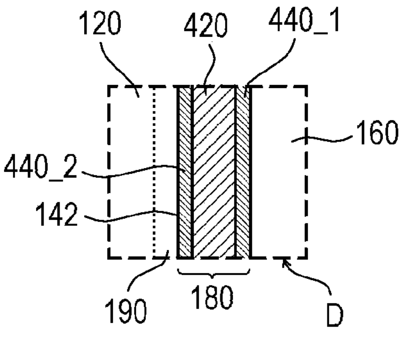
FIG. 4C is a schematic partial cross-sectional view of detail D of FIG. 1 according to a third example of a gate insulating structure including a piezoelectric layer.

Referring to FIG. 4C, according to a third example, the insulating structure 180 may comprise a first insulating layer 440_1 and a second insulating layer 440_2, wherein the layer of piezoelectric material 420 may be sandwiched between the first insulating layer 440_1 and the second insulating layer 440_2. In this case, the first insulating layer 440_1 may directly contact the transistor gate 160 and/or the second insulating layer 440_2 may directly contact the channel region 190 (or the sidewall 142 as explained above). In this example, the insulating structure 180 may be composed of e.g. only the layer of piezoelectric material 420, the first insulating layer 440_1 and the second insulating layer 440_2.

Figure 4D:
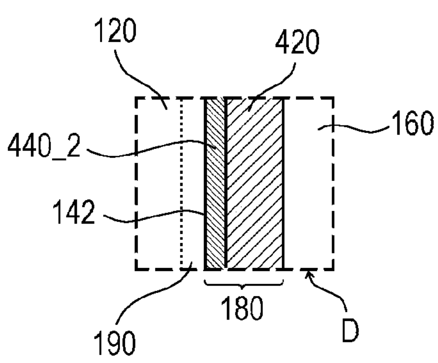
FIG. 4D is a schematic partial cross-sectional view of detail D of FIG. 1 according to a fourth example of a gate insulating structure including a piezoelectric layer.

Referring to FIG. 4D, according to a fourth example, the insulating structure 180 may comprise the second insulating layer 440_2 which is sandwiched between the channel region 190 (or the sidewall 142 of the gate trench 140) and the layer of piezoelectric material 420. The layer of piezoelectric material 420 may, e.g., directly contact the transistor gate 160. In this case, the insulating structure 180 may be composed only of the layer of piezoelectric material 420 and the second insulating 440_2.

In all examples the first insulating layer 440_1 and/or the second insulating layer 440_2 may be a $SiO_2$ layer. The $SiO_2$ layer may, e.g., be deposited or thermally grown or may be formed by a combination of these processes.

The thickness of the insulating structure 180 including the layer of piezoelectric material 420 and the insulating layers 440_1, 440_2 optionally contained therein depends on many parameters, e.g. on the voltage class of the power transistor device 100, on the piezoelectric material, on the configuration of the insulating structure 180 in view of FIGS. 4A-4D and on the semiconductor material of the substrate 120. Preferably the piezoelectric material has a dielectric constant that is as small as possible. This is because the higher the dielectric constant of the piezoelectric material, the thicker the layer of piezoelectric material 420 needs to be in order to produce a voltage blocking effect comparable to that of a pure gate oxide. Typical gate oxide comprises or is of $SiO_2$ and has a dielectric constant of 3.9. If, for example, AlN is used as dielectric material, the piezoelectric layer 420 needs to be about 2.5 times as thick to achieve the same voltage blocking effect as the gate oxide, since the dielectric constant of AlN is about 9.

In this respect, layer stacks of one or more insulating layers 440_1, 440_2 and the layer of piezoelectric material 420 can be advantageous, as they increase the breakdown voltage (and thus the voltage class) of the power transistor device 100. On the other hand, the insulating layers 440_1, 440_2 may reduce the strain imparted on the channel region 190.

In view of the above, the second example (FIG. 4B) may be beneficial because it allows to directly contact the channel region 190 by the layer of piezoelectric material 420, while the desired voltage class may be obtained by dimensioning the first insulating layer 440_1 to a sufficient thickness.

FIG. 5A illustrates an exemplary power transistor device 500. The power transistor device 500 is designed in accordance with the power transistor device 100 (FIG. 1) and, e.g., the insulating structure 180 of FIG. 4A, and reference is made to above description to avoid reiteration.

The power transistor device 500 may include a body region 510 formed in the semiconductor substrate 120. The body region 510 may include the channel region 190 to which the strain produced by the layer of piezoelectric material 420 is transferred. The power transistor device 500 further includes a source (or emitter) region 520 in the semiconductor substrate 120 above the body region 510. Vertical current flow through the channel region 190 is controlled by applying a gate potential to the transistor gate 160.

The power transistor device 500 may further include a drift zone region 530 in the semiconductor substrate 120. The drift zone region 530 may be located below the body region 510. The drift zone region 530 may be electrically connected to a base substrate 540. The base substrate 540 may be contacted by a drain (or collector) metal 550.

The semiconductor substrate 120 may further include a contact region 560 which extends into the substrate 120. The contact region 560 is separated from the gate trench 140 by a portion of the source (or emitter) region 520 and a portion of the body region 510. The contact region 560 may be contacted by a source (or emitter) metal 570 and may, e.g., extend down below the bottom of the gate trench 140. Further, another contact region 580 may be provided in the semiconductor substrate 120 and contacts the source (or emitter) metal 570.

The transistor gate 160 (gate electrode) may comprise or be of an electrically conductive material, e.g. of doped polysilicon. In other examples, it may comprise or be of carbon and/or metal. The material of the transistor gate 160 (gate electrode) may, e.g., not be provided with any piezoelectric material. In other words, the layer of piezoelectric material is formed between a sidewall of the transistor gate 160 (gate electrode material) and the sidewall of the gate trench, but may not be present in the transistor gate 160 (i.e. in the gate electrode material).

Depending on the type of the power transistor device 500, variations from the example shown in FIG. 5A are possible and additional structures may be formed. For example, the drift zone 530 may be connected to the drain (or collector) metal 550 via a base layer 590.

The power transistor device 500 may, e.g. be a power MOSFET or an IGBT. In the example shown in FIG. 5A, the power transistor device 500 is an n-channel MOSFET. The source region 520 may be highly doped n-type, the body region 510 may be doped p-type and the drift zone region 530 may be doped n-type. The contact regions 560, 580 may be highly doped p-type or, e.g., may be formed by contact trenches filled with an electrically conductive material such as doped polysilicon, metal, etc. The base substrate 540 connecting to the metal may be highly doped n-type and the (optional) base layer 590 may be lowly doped n-type.

If the power transistor device 500 is an IGBT, the source corresponds to an emitter of the device 500 and the drain corresponds to the collector of the device 500.

The semiconductor substrate 120 may comprise one or more epitaxial layers grown on the base substrate 540.

FIG. 5B illustrates a further example of a power transistor device 500. The power transistor device 500 of FIG. 5B may be different from the power transistor device 500 of FIG. 5A by using an insulating structure 180 as illustrated in FIG. 4B rather than in FIG. 4A.

In both power transistor devices 500 (FIG. 5A and FIG. 5B), the layer of piezoelectric material 420 is placed as close as possible to the channel region 190. That way, a highly effective transfer of strain into the channel region 190 is possible. In other words, the converse piezoelectric effect, providing a stress induced change in mobility of the charge carriers, can be used with high efficiency in these examples.

The power transistor devices 500 of FIGS. 5C and 5D may be similar or identical to the power transistor device 500 of FIG. 5A or 5B with the exception that the insulating structure 180 is in accordance with the third and fourth example (FIG. 4C and FIG. 4D), respectively. In both examples the second insulating layer 440_2 is sandwiched between the channel region 190 and the layer of piezoelectric material 420. In this way the proven channel-to-oxide interface can be maintained. The second insulating layer 440_2 may be chosen as thin as possible in order to ensure high strain transfer into the channel region 190.

FIGS. 6A-6D illustrate the power transistor devices 500 of FIGS. 5A-5D, respectively, showing two gate trenches 140 and a source electrode 620 arranged between the two gate trenches 140. The source electrode 620 may be formed by a source trench filled with an electrically conducting material or by a source region 520 as described above.

In FIG. 6A the layer of piezoelectric material 420 is deposited in the gate trench 140 and acts as a gate dielectric material. The layer of piezoelectric material 420 needs to be of a certain thickness taking into account the dielectric permittivity of the piezoelectric material to obtain a certain threshold voltage and breakdown voltage of the insulating structure 180. This power transistor device 500, featuring the first example of the insulating structure 180 (FIG. 4A), is the most effective way of transferring the strain from the layer of piezoelectric material 420 to the channel region 190, thereby causing the largest change in charge carrier mobility in the channel region 190.

In FIG. 6B, using the second example of the insulating structure 180 (FIG. 4B), the thickness of the layer of piezoelectric material 420 and the thickness of the first insulating layer 440_1 can be carefully chosen to obtain a certain desired threshold voltage. Here the layer of piezoelectric material 420 is deposited first and then the first insulating layer 440_1 is deposited. This implementation provides also for an effective strain transfer from the layer of piezoelectric material 420 into the channel region 190 since the layer of piezoelectric material 420 is directly in contact with the channel region 190.

The power transistor device 500 of FIG. 6C, using the third example of the insulating structure 180 of FIG. 4C, ensures that the interface of the insulating structure 180 to the channel region 190 and the interface of the insulating structure 180 to the transistor gate 160 are not disturbed. However, the effectiveness of the strain transfer into the channel region 190 may, to some extent, be impeded by the second insulating layer 440_2.

The power transistor device 500 of FIG. 6D uses the fourth example of an insulating structure 180 as shown in FIG. 4D. The interface quality of the channel region 190 to the insulating structure 180 is preserved, and the layer of piezoelectric material 420 is able to transfer the strain to the channel region 190 through the initially deposited second insulating layer 440_2. Although this measure will reduce the stress acting on the channel region 190, and hence, a smaller change in charge carrier mobility is expected, a modulation of channel resistance can still be observed.

FIGS. 7A-7D illustrate examples of a power transistor device 700 in which a first field plate 720 is provided in the gate trench 140 below the transistor gate 160.

The first field plate 720 may be electrically insulated from the transistor gate 160. For example, the split gate construction of FIGS. 7A-7D may be formed by two doped polysilicon regions, an upper gate portion forming the transistor gate 160 (i.e. the gate electrode) and a lower portion forming the "buried" first field plate 720.

The field plate 720 may be separated from the drift zone region 530 by an insulating region or insulating layer 730. In other examples, the buried first field plate 720 may be formed by drift zone doping.

The first field plate 720 enables to increase the doping concentration in the drift zone region 530 without impairing voltage blocking capability.

The first field plate 720 may be electrically floating. In other examples the first field plate 720 may be electrically connected to the gate potential (transistor gate 160) or to the source potential (e.g. source region 520 and/or source electrode 620).

When the first field plate 720 is electrically connected to the gate potential, the resistance of the drift zone region 530 is improved (i.e. reduced), but the gate charge is increased resulting in a slower switching behavior.

When the first field plate 720 is electrically connected to the source potential, the gate charge is decreased, resulting in the power transistor device 700 having a faster switching response. Therefore, in many practical cases, it may be advantageous to connect the first field plate 720 to the source potential.

The insulating structure 180 (reference sign not shown in FIG. 7) including the layer of piezoelectric material 420 may extend between the transistor gate 160 and the first field plate 720.

The power transistor devices 700 of FIGS. 7A to 7D may distinguish from each other only by the configuration of the insulating structure 180, which is designed in accordance with the first to fourth examples (FIGS. 4A-4D), respectively.

Further examples of a power transistor device 800 are illustrated in FIGS. 8A-8D. In these power transistor devices 800 a second field plate 820 is provided in a field plate trench 840.

The field plate trench 840 is separate from the gate trench 140. The second field plate 820 may be formed of an electrically conductive material, e.g. the same material as used for forming the source electrode 620. The second field plate 820 may be directly connected to and/or integral with the source electrode 620. The second field plate 820 may reach down into the drift zone region 530 of the power transistor device 800 and may, e.g., be separated from the drift zone region 530 by an insulating region or insulating layer 830.

In all power transistor devices 100, 500, 700, 800 the gate trench 140 may, e.g., be of a grid or line or needle type pattern in top view. The field plate trench 840 of FIGS. 8A-8D may, e.g., be of a needle or stripe type pattern in top view.

In all power transistor devices 100, 500, 700, 800 the layer of piezoelectric material 420 may be configured such that in the OFF state of the power transistor device 100, 500, 700, 800 the strain introduced into the channel region 190 in the ON state of the power transistor device 100, 500, 700, 800 disappears.

In all power transistor devices 100, 500, 700, 800 the layer of piezoelectric material 420 may be electrically floating. In this case, the piezoelectric material is driven by the electrical field between the transistor gate 160 and the source electrode 620. In other examples the layer of piezoelectric material 420 may be electrically connected to the source electrode 620 or to the transistor gate (gate electrode) 160 (see e.g. FIGS. 4A, 4D, 5A, 5D, 6A, 6D, 7A, 7D, 8A, 8D).

In some power transistor devices, in particular SiC MOSFETs, the drift zone region ON state resistance can become considerably high and may contribute to e.g. the majority of the total resistance of the power transistor device. In this regard, it may be beneficial to improve the electrical properties in the drift zone region 530.

Figure 9:
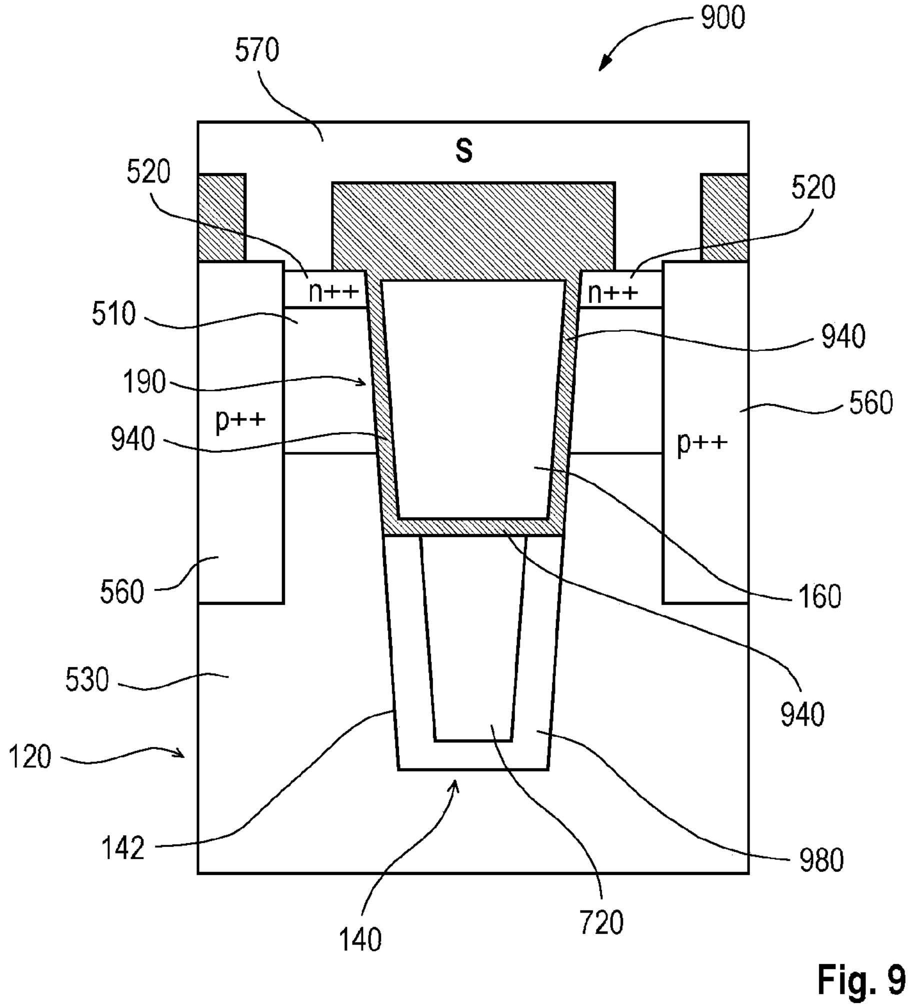
FIG. 9 is a schematic partial cross-sectional view of an example of a trench power transistor device having a field plate insulating structure including a piezoelectric layer.

Referring to FIG. 9, a power transistor device 900 may comprise a semiconductor substrate 120 and a gate trench 140 extending into the semiconductor substrate 120. A transistor gate (gate electrode) 160 is provided in the gate trench 140. Further, the power transistor device 900 includes a first field plate 720.

According to a second aspect of the disclosure, an insulating structure 980 is formed between the first field plate 720 and a sidewall 142 of the gate trench 140.

The insulating structure 980 is configured to electrically insulate the first field plate 720 from the drift zone region 530 which extends along the sidewall 142 of a lower portion of the gate trench 140. The insulating structure 980 includes a layer of piezoelectric material (not shown in FIG. 9).

More specifically, the insulating structure 980 may have the same design options as the insulating structure 180. These design options have been described in conjunction with FIGS. 4A to 4D.

That is, the insulating structure 980 may, e.g., consist of a layer of piezoelectric material 420 or may be composed of a layer of piezoelectric material 420 and one or a plurality of insulating layers 440_1, 440_2 located at one or both sides of the layer of piezoelectric material 420.

That is, the layer of piezoelectric material 420 contained in the insulating structure 980 may directly contact the drift zone region 530. This example compares to the examples of FIGS. 4A and 4B, where the layer of piezoelectric material 420 directly contacts the channel region 190. Further, it is to be noted that the (optional) insulating layer(s) 440_1, 440_2 may directly contact the drift zone region 530 and/or the first field plate 720, and may be $SiO_2$ layer(s) as describe above.

The transistor gate 160 is separated from the channel region 510 by a gate dielectric layer 940. In one example the gate dielectric layer does not include any piezoelectric material, i.e. may be a standard channel oxide. In other examples the gate dielectric layer 940 may, e.g., be identical with the insulating structure 180 described above. In this case, the power transistor device 900 is provided with a piezoelectric insulating structure 180 and a piezoelectric insulating structure 980.

The first field plate 720 may be electrically insulated from the transistor gate 160. For instance, the gate dielectric layer 940 may separate the first field plate 720 from the transistor gate 160. In terms of further (optional) features of the transistor gate 160 and of the first field plate 720, reference is made to the above description to avoid reiteration.

Similar as described above for the effect of the insulating structure 180 on the channel region 190, the insulating structure 980 may enhance the charge carrier mobility in the drift zone region 530, thereby reducing the ON state resistance $R_{ON}$. With other words, the strain from the layer of piezoelectric material 420 in the insulating structure 980 is transferred to the drift zone region 530 in the transistor device ON state. This, on the other hand, allows to increase the breakdown-field (owing to a relatively thick layer of piezoelectric material for a high-K piezoelectric material), yet providing a low $R_{ON}$.

The first field plate 720 may be electrically insulated from the transistor gate 160, as e.g. shown in FIG. 9. In some examples, the first field plate 720 may be electrically floating. In other examples the first field plate 720 may be connected to the source (or emitter) region 520 or may be electrically connected to the transistor gate 160. Reference is made to the description of FIGS. 7A to 7D to avoid reiteration.

When the first field plate 720 is electrically connected to the source (or emitter) region 520, a high switching speed can be achieved, since less charge needs to flow into the transistor gate 160. However, the resistance of the drift zone region 530 may be degraded (i.e. increased), which would increase the ON-state resistance $R_{ON}$. This increase of the ON-state resistance $R_{ON}$ is, however, counteracted by the strain imparted to the drift zone region 530.

In all examples described herein, the choice of the piezoelectric material significantly affects the performance of the power transistor device 100, 500, 700, 800, 900. The following aspects are to be taken into account:

First, the band alignments of the conduction and valance bands with respect to the semiconductor band structure are to be considered. This band-offset assumes critical importance as the entire advantages of involving the piezoelectric material in the insulating structure 180 could be nullified by gate leakage currents due to electron emission into the conduction band, and no reliable power transistor device could be realized.

Second, a choice of piezoelectric material with high piezoelectric coefficient ($d_{33}$) is desirable. However, technological implementation of such materials in Si/SiC/GaN foundries must be considered. Furthermore, materials with large $d_{33}$ inherently have a very high dielectric constant, which might inhibit reliable growth of such materials in downscaled devices. A conformal growth of such materials in gate trenches 140 needs to be ensured, too.

The layer of piezoelectric material 420 may, e.g., comprise $BaTiO_3$ (BTO) or $Pb(Zr,Ti)O_3$ (PZT) or Al(Sc)N or doped $ZrO_2$.

BTO and PZT (dielectric permittivity ε~800 and piezoelectric coefficient $d_{33}$~53 pm/V) provide viable options to realize a device with the mentioned properties. However, reliable processability of such materials in Si/SiC foundries may be challenging.

Al(Sc)N is a piezoelectric material that can be conformally deposited in high aspect ratio trenches by MOCVD (Metal-Organic Chemical Vapor Deposition) and ALD (Atomic Layer Deposition) processes. Further, the piezoelectric effect of Al(Sc)N can be tuned by varying the doping density of Sc, wherein the $d_{33}$ values peak at about 40% Sc doping. Moreover, the dielectric permittivity of Al(Sc)N is only ε~9, which makes it a very suitable piezoelectric material for such an application. Another advantage is the high thermal conductivity of this material (in particular in relation to $SiO_2$) which helps to avoid or at least reduce hotspot formation in the region of the gate oxide which is a critical issue for overstress conditions (in particular for SiC-based power transistor devices).

Al(Sc)N is also a ferroelectric material for a range of doping concentration of Sc with a relatively high Curie temperature. Thus, this material may be tuned for its Sc content to accentuate the desired piezoelectric nature within the specified doping range.

For example, Al(Sc)N, which can be written as $Al_{1-x}Sc_xN$, may have a preferred range of x between, e.g., 0 and 0.5, in particular 0.3 and 0.47, wherein the $d_{33}$ values peak at about x=0.4 as mentioned above.

Other piezoelectric materials such as e.g. doped $ZrO_2$ are also possible. Doping of $ZrO_2$ with various elements such as, e.g., Mg, In, La and Y is possible. The proposed idea and the corresponding principle of operation would be the same for all piezoelectric materials. However, the effect of strain on channel region or drift zone mobility enhancement is more pronounced for piezoelectric materials with a higher $d_{33}$ coefficient, which may limit the number of suitable materials.

The following examples pertain to further aspects of the disclosure:

Example 1 is a power transistor device includes a semiconductor substrate, a gate trench extending into the semiconductor substrate, a transistor gate provided in the gate trench and an insulating structure formed between the transistor gate and a side wall of the gate trench. The insulating structure is configured to electrically insulate the transistor gate from a channel region which extends along the side wall of the gate trench. The insulating structure comprises a layer of piezoelectric material.

In Example 2, the subject matter of Example 1 can optionally include wherein the insulating structure further comprises a first insulating layer, the first insulating layer being sandwiched between the transistor gate and the layer of piezoelectric material.

In Example 3, the subject matter of Example 1 can optionally include wherein the layer of piezoelectric material directly contacts the channel region.

In Example 4, the subject matter of Example 1 can optionally include wherein the insulating structure further comprises a second insulating layer, the second insulating layer being sandwiched between the side wall of the gate trench and the layer of piezoelectric material.

In Example 5, the subject matter of Example 4 can optionally include wherein the layer of piezoelectric material directly contacts the transistor gate.

In Example 6, the subject matter of Example 1 can optionally include wherein the insulating structure further comprises a first insulating layer and a second insulating layer, the layer of piezoelectric material being sandwiched between the first insulating layer and the second insulating layer.

In Example 7, the subject matter of one of Examples 2 to 6 can optionally include wherein the first insulating layer and/or the second insulating layer is a $SiO_2$ layer.

In Example 8, the subject matter of Example 1 can optionally include wherein the layer of piezoelectric material directly contacts the transistor gate and directly contacts the channel region.

In Example 9, the subject matter of any preceding Example can optionally further include a body region in the semiconductor substrate; a source or emitter region in the semiconductor substrate above the body region; and a drift zone region in the semiconductor substrate below the body region.

In Example 10, the subject matter of any preceding Example can optionally further include a first field plate provided in the gate trench below the transistor gate.

In Example 11, the subject matter of Example 10 can optionally include wherein the first field plate is electrically insulated from the transistor gate and the layer of piezoelectric material extends between the transistor gate and the first field plate.

In Example 12, the subject matter of any preceding Example can optionally further include a second field plate provided in a field plate trench which is separate from the gate trench.

In Example 13, the subject matter of any preceding Example can optionally include wherein the layer of piezoelectric material comprises Al(Sc)N or $BaTiO_3$ or $Pb(Zr,Ti)O_3$ or doped $ZrO_2$.

In Example 14, the subject matter of any preceding Example can optionally include wherein the layer of piezoelectric material is configured to enhance the mobility of charge carriers in the channel region by introducing strain into the channel region that occurs in an ON state of the power transistor device as a result of the converse piezoelectric effect.

In Example 15, the subject matter of Example 14 can optionally include wherein the layer of piezoelectric material is configured such that in an OFF state of the power transistor device the strain introduced into the channel region in the ON state of the power transistor device disappears.

In Example 16, the subject matter of any preceding Example can optionally include wherein the power transistor device is a trench power MOSFET or a trench power IGBT.

Example 17 is a power transistor device includes a semiconductor substrate, a gate trench extending into the semiconductor substrate, a transistor gate provided in the gate trench, a first field plate provided in the gate trench below the transistor gate, and an insulating structure formed between the first field plate and a side wall of the gate trench, the insulating structure being configured to electrically insulate the first field plate from a drift zone region which extends along the side wall of the gate trench, the insulating structure comprising a layer of piezoelectric material.

In Example 18, the subject matter of Example 17 can optionally include wherein the layer of piezoelectric material directly contacts the drift zone region.

In Example 19, the subject matter of Example 17 or 18 can optionally include wherein the insulating structure further comprises at least one additional insulating layer.

In Example 20, the subject matter of Example 19 can optionally include wherein the at least one additional insulating layer is a $SiO_2$ layer.

In Example 21, the subject matter of any of Examples 17 to 20 can optionally include wherein the first field plate is electrically insulated from the transistor gate.

In Example 22, the subject matter of Example 21 can optionally further include a body region in the semiconductor substrate; and a source or emitter region in the semiconductor substrate above the body region, wherein the first field plate is electrically connected to the source or emitter region.

In Example 23, the subject matter of any of Examples 17 to 20 can optionally include wherein the first field plate is electrically connected to the transistor gate.

In Example 24, the subject matter of any of Examples 17 to 23 can optionally include wherein the layer of piezoelectric material comprises Al(Sc)N or $BaTiO_3$ or $Pb(Zr,Ti)O_3$ or doped $ZrO_2$.

In Example 25, the subject matter of any of Examples 17 to 24 can optionally include wherein the layer of piezoelectric material is configured to enhance the mobility of charge carriers in the drift zone region by introducing strain into the drift zone region that occurs in an ON state of the power transistor device as a result of the converse piezoelectric effect.

In Example 26, the subject matter of Example 25 can optionally include wherein the layer of piezoelectric material is configured such that in an OFF state of the power transistor device the strain introduced into the drift zone region in the ON state of the power transistor device disappears.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power transistor device, comprising:
a semiconductor substrate;
a gate trench extending into the semiconductor substrate;
a transistor gate provided in the gate trench; and
an insulating structure formed between the transistor gate and a side wall of the gate trench, the insulating structure being configured to electrically insulate the transistor gate from a channel region which extends along the side wall of the gate trench, the insulating structure comprising a layer of piezoelectric material,
wherein the insulating structure further comprises an insulating layer sandwiched between the side wall of the gate trench and the layer of piezoelectric material.

2. The power transistor device of claim 1, wherein the insulating structure further comprises an insulating layer sandwiched between the transistor gate and the layer of piezoelectric material.

3. The power transistor device of claim 2, wherein the insulating layer is a $SiO_2$ layer.

4. The power transistor device of claim 1, wherein the layer of piezoelectric material directly contacts the transistor gate.

5. The power transistor device of claim 1, wherein the insulating layer is a $SiO_2$ layer.

6. The power transistor device of claim 1, further comprising:
a body region in the semiconductor substrate;
a source or emitter region in the semiconductor substrate above the body region; and
a drift zone region in the semiconductor substrate below the body region.

7. The power transistor device of claim 1, further comprising:
a field plate in the gate trench below the transistor gate.

8. The power transistor device of claim 7, wherein the field plate is electrically insulated from the transistor gate, and wherein the layer of piezoelectric material extends between the transistor gate and the field plate.

9. The power transistor device of claim 1, further comprising:
a field plate provided in a field plate trench which is separate from the gate trench.

10. The power transistor device of claim 1, wherein the layer of piezoelectric material comprises Al(Sc)N or $BaTiO_3$ or Pb $(Zr,Ti)O_3$ or doped $ZrO_2$.

11. The power transistor device of claim 1, wherein the layer of piezoelectric material is configured to enhance the mobility of charge carriers in the channel region by introducing strain into the channel region that occurs in an ON state of the power transistor device as a result of the converse piezoelectric effect.

12. The power transistor device of claim 11, wherein the layer of piezoelectric material is configured such that in an OFF state of the power transistor device, the strain introduced into the channel region in the ON state of the power transistor device disappears.

13. The power transistor device of claim 1, wherein the power transistor device is a trench power MOSFET or a trench power IGBT.

14. A power transistor device, comprising:

a semiconductor substrate;

a gate trench extending into the semiconductor substrate;

a transistor gate provided in the gate trench;

a field plate provided in the gate trench below the transistor gate; and an insulating structure formed between the field plate and a side wall of the gate trench, the insulating structure being configured to electrically insulate the field plate from a drift zone region which extends along the side wall of the gate trench, the insulating structure comprising a layer of piezoelectric material.

15. The power transistor device of claim 14, wherein the layer of piezoelectric material directly contacts the drift zone region.

16. The power transistor device of claim 14, wherein the insulating structure further comprises at least one additional insulating layer.

17. The power transistor device of claim 16, wherein the at least one additional insulating layer is a $SiO_2$ layer.

18. The power transistor device of claim 14, wherein the field plate is electrically insulated from the transistor gate.

19. The power transistor device of claim 18, further comprising:

a body region in the semiconductor substrate; and a source or emitter region in the semiconductor substrate above the body region, wherein the field plate is electrically connected to the source or emitter region.

20. The power transistor device of claim 14, wherein the field plate is electrically connected to the transistor gate.

21. The power transistor device of claim 14, wherein the layer of piezoelectric material comprises Al(Sc)N or $BaTiO_3$ or Pb $(Zr,Ti)O_3$ or doped $ZrO_2$.

22. The power transistor device of claim 14, wherein the layer of piezoelectric material is configured to enhance the mobility of charge carriers in the drift zone region by introducing strain into the drift zone region that occurs in an ON state of the power transistor device as a result of the converse piezoelectric effect.

23. The power transistor device of claim 22, wherein the layer of piezoelectric material is configured such that in an OFF state of the power transistor device, the strain introduced into the drift zone region in the ON state of the power transistor device disappears.

24. A power transistor device, comprising:

a semiconductor substrate;

a gate trench extending into the semiconductor substrate;

a transistor gate provided in the gate trench; and an insulating structure formed between the transistor gate and a side wall of the gate trench, the insulating structure being configured to electrically insulate the transistor gate from a channel region which extends along the side wall of the gate trench, the insulating structure comprising a layer of piezoelectric material, wherein the insulating structure further comprises a first insulating layer and a second insulating layer, the layer of piezoelectric material being sandwiched between the first insulating layer and the second insulating layer.

25. The power transistor device of claim 24, wherein the first insulating layer and/or the second insulating layer is a $SiO_2$ layer.

26. A power transistor device, comprising:

a semiconductor substrate;

a gate trench extending into the semiconductor substrate;

a transistor gate provided in the gate trench;

an insulating structure formed between the transistor gate and a side wall of the gate trench, the insulating structure being configured to electrically insulate the transistor gate from a channel region which extends along the side wall of the gate trench, the insulating structure comprising a layer of piezoelectric material; and a field plate provided in a field plate trench which is separate from the gate trench.

* * * * *